US012721078B2

(12) United States Patent
Langa et al.

(10) Patent No.: US 12,721,078 B2
(45) Date of Patent: Aug. 25, 2026

(54) METHOD FOR LASER-BASED SINGULATING OF MICROCHIPS ON STRUCTURED SUBSTRATES

(71) Applicant: Fraunhofer-Gesellschaft zur Förderung der angewandten Forschung e.V., Munich (DE)

(72) Inventors: Sergiu Langa, Dresden (DE); Thomas Ludewig, Dresden (DE); Andreas Mrosk, Dresden (DE); Andreas Gang, Moritzburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 381 days.

(21) Appl. No.: 18/427,240

(22) Filed: Jan. 30, 2024

(65) Prior Publication Data

US 2024/0258171 A1 Aug. 1, 2024

(30) Foreign Application Priority Data

Jan. 30, 2023 (DE) ......................... 102023200718.5

(51) Int. Cl.
*H10P 54/00* (2026.01)
*H10P 34/42* (2026.01)

(52) U.S. Cl.
CPC .............. *H10P 54/00* (2026.01); *H10P 34/42* (2026.01)

(58) Field of Classification Search
CPC ................................ H10P 54/00; H10P 34/42
See application file for complete search history.

(56) References Cited

U.S. PATENT DOCUMENTS

2001/0054606 A1* 12/2001 Weishauss .............. H10P 54/00 219/121.74
2007/0111477 A1 5/2007 Maruyama et al.
(Continued)

FOREIGN PATENT DOCUMENTS

DE 102006053597 A1 5/2007
DE 102016224978 A1 6/2018
(Continued)

OTHER PUBLICATIONS

Stealth Dicing(TM) technology Hamamatsu Photonics.

*Primary Examiner* — Suberr L Chi
(74) *Attorney, Agent, or Firm* — PV IP PC; Wei Te Chung

(57) ABSTRACT

The subject-matter of this disclosure is a method for singulating microchips. The method includes providing a single-layer or multi-layer substrate. The method further includes laser-based creating microcracks in the substrate using a laser beam that penetrates the substrate, wherein the laser beam is guided laterally around the microchips so as to generate singulating scribe lines in the substrate along which the microchips are to be singulated. The laser beam is guided laterally across the substrate in multiple passes, wherein the focal point of the laser beam is set to different penetration depths in different passes each so that the microcracks generated in the focal point are generated in the substrate in a step-wise manner. According to the disclosure, at least one recess is generated in the substrate, wherein the recess extends at least partially in a lateral direction along one of the singulating scribe lines.

20 Claims, 5 Drawing Sheets

(56) References Cited

U.S. PATENT DOCUMENTS

| | | | | |
|---|---|---|---|---|
| 2007/0111478 | A1* | 5/2007 | Komura | B23K 26/40 257/E21.599 |
| 2015/0207297 | A1* | 7/2015 | Fukaya | H01S 5/185 438/33 |
| 2023/0170257 | A1* | 6/2023 | Liu | H10P 54/00 438/462 |

FOREIGN PATENT DOCUMENTS

| | | | |
|---|---|---|---|
| JP | 2003338468 | A | 11/2003 |
| JP | 2022071275 | A | 5/2022 |

* cited by examiner

METHOD FOR LASER-BASED SINGULATING OF MICROCHIPS ON STRUCTURED SUBSTRATES

CROSS-REFERENCE TO RELATED APPLICATION

This application claims priority from German Patent Application No. 10 2023 200 718.5, which was filed on Jan. 30, 2023, and is incorporated herein in its entirety by reference.

The innovative concept described herein concerns a method for singulating microchips using laser-based separation methods. In particular, the present application describes an innovative concept to generate continuous scribe lines in single-layer or multi-layer wafer substrates even though the penetration depth of the laser is less than the layer thickness of the wafer substrate.

BACKGROUND

Nowadays, efforts are made to miniaturize mechanical structures, electrical structures, or a combination of the two, ever further. Thus, the above-mentioned structures are often manufactured using suitable micro-structuring techniques. For example, they can be used to manufacture micro-electromechanical systems, also referred to as MEMS. In addition, electronic circuits, so-called ICs (integrated circuits), are nowadays manufactured using micro-structuring techniques.

The structures made using micro-structuring techniques are manufactured in the form of chips or microchips. In this case, a multitude of chips can be generated in a wafer composite, i.e. multiple chips arranged laterally next to each other may be processed, or manufactured, simultaneously on a common wafer (e.g. a silicon disc). The fully processed chips are then singulated using suitable separation methods, i.e. the individual chips are separated from the wafer. This step of singulating is essential for many applications so as to at least not exceed structural size limitations. However, singulating involves a careful process that has to be adapted to the components of the individual chip.

Laser-based separation methods have shown to be particularly advantageous for the singulating of chips. In contrast to classic mechanical wafer-separation methods, such as singulating using sawing, laser-based separation methods are so-called dry processes. That is, coolants, such as DI water (DI: de-ionized), do not have to be used in a laser-based separation method, preventing contaminations due to the corresponding coolants. Through the dry process, damage of the sensitive components on the chips may be prevented. In addition, in laser-based separation methods, damages only occur in the crystal grid in the sawing lanes due to focusing of the laser. There is no ablation of the material to be separated. In addition, related sawing methods face significant place requirements, which may be significantly minimized using laser-based separation methods. As a result, contamination with particles is reduced to a minimum in laser-based separation methods.

In laser-based separation methods, the laser beam penetrates the substrate (e.g. wafer) and generates microcracks in the substrate in the focal point. Here, the laser beam is guided laterally across the substrate, which generates in the substrate multiple microcracks arranged in a row. The laser beam is guided across the substrate in multiple passes, wherein the penetration depth of the focal point is varied in its height (i.e. vertically) in each pass. Through this, multiple microcrack rows arranged above each other are generated, which then in turn form a scribe line in the substrate. In this case, multiple scribe lines distributed in a grid-shape across the entire wafer are formed, with each chip being surrounded by four scribe lines. The actual singulating of the chip is ultimately carried out through expansion. In this case, the wafer is pulled apart laterally (e.g. using a foil attached to the wafer), breaking up the microcracks in the scribe lines. Thus, the scribe lines act as a type of perforation surrounding the individual chips.

In principle, wafer substrates used for manufacturing the chips may possibly include multiple layers stacked on top of each other. In this case, multiple individual substrate layers are placed on top of each other in layers and are bonded to each other. In this case, the substrate layers are stacked on top of each other perpendicular to the lateral substrate plane. That is, the substrate layers extending horizontally in the substrate plane are stacked vertically on top of each other. This results in a vertical layer stack with multiple individual substrate layers. The more individual substrate layers are placed on top of each other, the thicker the layer stack generated.

As initially mentioned, the penetration depth of the focal point of the laser beam may be varied. Typical maximum penetration depths amount to approximately 700 μm, corresponding to the thickness of a standard wafer. However, if the substrate or the wafer is thicker, the laser beam can no longer penetrate the substrate to a sufficient depth. If the wafer is embodied in the form of a layer stack with multiple substrate layers stacked on top of each other, the thickness of the wafer will be significantly greater than the thickness of a standard wafer. In this case, the laser beam can also no longer penetrate the wafer to a sufficient depth in order to generate microcracks or scribe lines across the entire thickness of the wafer.

In addition, the penetration depth of the laser beam strongly depends on the substrate structure (e.g. doping of individual substrate layers, materials of the substrate layers, interfaces made of air, reflecting (e.g. metallic) surfaces, etc.). For example, the higher the doping of the wafer or the substrate, or the more metallic layers in a layer stack, the smaller the depth up to which the laser beam is ultimately able to penetrate the substrate. These external boundary conditions therefore limit the penetration depth of the laser additionally. On the other hand, these external boundary conditions ultimately also limit the thickness of the substrate to be separated. That is, the more particular features a substrate has (e.g. high doping, many interfaces, multiple substrate layers, etc.), the thinner it has to be so as to achieve good separation of the chips using laser-based separation methods.

That is, if the laser passes cannot be generated across the entire depth of the substrate, the separation of the chips is not effective. For example, the edges at the scribe lines broken open (e.g. the later chip edges) are not sufficiently smooth, or individual manual adjustments have to be carried out so as to achieve final singulating of the chips.

A related technology solution approach for this problem proposes to process thick substrates with the laser from the front side and from the rear side. Through this, the thickness of a substrate to be separated may be increased to approximately twice that of a standard wafer thickness.

However, this approach reaches its limits if the substrate becomes even thicker, e.g. 1 mm to 2 mm. Front and rear sides can still be processed with the laser. However, due to the limited penetration depth of the laser beam, a region in the middle of the substrate which the laser beam cannot reach is left out. As a result, microcracks cannot be generated at this location, i.e. approximately in the middle of the substrate. Thus, in this case, singulating the chips is not possible without problems. Here, mechanical post-processing of the tear edges is usually involved, however, this may be of disadvantage for the components contained on the chip or it might even lead to their destruction.

Thus, it would be desirable to improve available laser-based separation methods so that the above-mentioned problems would be solved. In particular, the innovative concept proposed herein provides a solution for the full separation of substrates even if the substrate thickness exceeds the maximum penetration depth of the laser beam (on both sides).

SUMMARY

An embodiment may have a method for singulating microchips, the method including: providing a single-layer or multi-layer substrate, laser-based creating microcracks in the substrate using a laser beam that penetrates the substrate, wherein the laser beam is guided laterally around the microchips so as to generate singulating scribe lines in the substrate along which the microchips are to be singulated, wherein the laser beam is guided laterally across the substrate in multiple passes, wherein the focal point of the laser beam is set to different penetration depths in different passes each so that the microcracks created in the focal point are generated in the substrate in a step-wise manner, and generating at least one recess in the substrate, wherein the recess extends at least partially in a lateral direction along one of the singulating scribe lines.

Among other things, the method includes providing a substrate. The method may be a single substrate. Alternatively, the substrate may be configured as a layer stack with at least two bonded substrate layers. The substrate may have a substrate thickness that is greater than the substrate thickness of a standard wafer. For example, the substrate thickness may be greater than 700 μm. A further method step includes laser-based creating of microcracks in the substrate using a laser beam that penetrates the substrate in a vertical direction (i.e. perpendicular to the substrate plane). In this case, the laser beam is guided on the surface of the substrate in a lateral direction around the microchips, wherein microcracks arranged in rows are generated in the substrate along the movement trajectory of the laser beam. These rows of microcracks create a type of perforation around the microchips. These perforations are also called singulating scribe lines. The singulating scribe lines form a type of predetermined breaking point in the substrate. The microchips are later singulated along these singulating scribe lines by mechanically breaking the microcracks open. To generate the singulating scribe lines in the substrate, the laser beam is laterally guided across the substrate in multiple passes, wherein the focal point of the laser beam is set to a different penetration depth in each pass, i.e. the penetration depth of the focal point into the substrate is varied in the vertical direction. Through this, the consecutive microcracks generated in the focal point are generated in the substrate in a step-wise manner, i.e. vertically above each other. In addition, according to the, at least one recess is generated in the substrate, wherein the recess extends at least partially in the lateral direction along one of the singulating scribe lines. The recess is generated by removing substrate material so that the substrate has a lower substrate thickness at this location. Thus, the laser beam may accordingly penetrate the substrate to a greater depth at the location with the reduced substrate thickness. That is, even if the substrate were to have a substrate thickness greater than the thickness of a standard wafer, the substrate can be fully separated with the method described herein.

BRIEF DESCRIPTION OF THE DRAWINGS

Embodiments of the present disclosure will be detailed subsequently referring to the appended drawings, in which.

DETAILED DESCRIPTION

Figure 1:
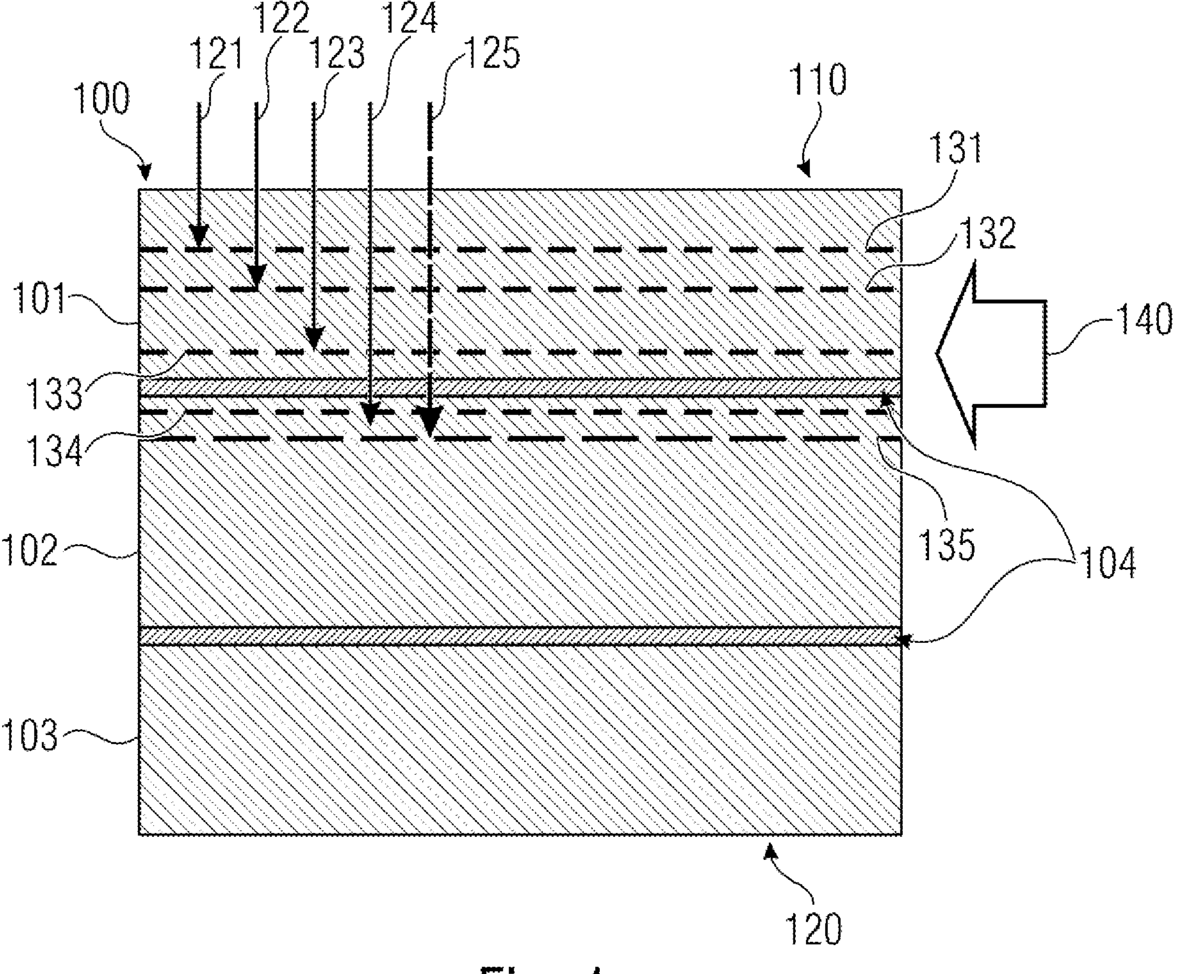
FIG. 1 shows a schematic lateral cross-sectional view of a substrate stack processed using a one-sided laser-based singulating method according related technology.

In the following, embodiments are described in more detail with reference to the drawings, wherein elements with the same or similar functions are provided with the same reference numerals.

Method steps represented or described in the context of the present disclosure may also be carried out in a sequence that differs from the represented or described sequence. In addition, method steps concerning a specific feature of an apparatus are interchangeable with said feature of the apparatus, and vice versa.

With reference to the drawings, substrates configured in the form of a substrate stack or layer stack are exemplarily described in the following. In this case, as an example only, substrate stacks including three individual substrate layers are described. Obviously, the method may also be carried out on substrates that are configured as a single substrate and accordingly include only a single substrate layer or a single substrate. Similarly, the method may also be carried out on substrates that are configured in the form of a substrate stack with two bonded substrate layers. Similarly, the method may also be carried out on substrates that are configured in the form of a substrate stack with more than the three bonded substrate layers exemplarily illustrated.

Furthermore, the substrate exemplarily illustrated in the drawings shows only a single microchip. However, the method may also be carried out on the wafer level, i.e. the substrate may be a wafer having a multitude of microchips processed thereon. Singulating scribe lines along which the respective microchips can then be singulated are generated laterally around each of these microchips, as exemplarily shown in the drawings for a single microchip, in the manner.

FIG. 1 shows in general terms a schematic lateral cross-sectional view of a substrate 100 that is, as an example only, configured in the form of a substrate stack. In the non-limiting example illustrated here, the substrate 100 or the substrate stack 100 includes three individual substrate layers 101, 102, 103. The individual substrate layers 101, 102, 103 are arranged vertically above each another (i.e. perpendicular to the substrate plane) and are bonded to each other, e.g. using (wafer) bonding.

Optionally, one or multiple further layers and/or interfaces 104 may be located between the individual substrate layers 101, 102, 103. For example, metal layers, oxide layers, and the like, may be located between the substrate layers 101, 102, 103.

The substrate stack 100 may now be processed using a laser. The laser beams are illustrated by the arrows 121, . . . , 125. Each arrow 121, . . . , 125 symbolizes a laser beam perpendicularly penetrating the substrate stack 100. The respective arrowhead of each arrow 121, . . . , 125 symbolizes the focal point of the respective laser beam.

As can be seen, the focal points of each laser beam 121, . . . , 125 are located on different vertical height levels, i.e. they penetrate the substrate stack 100 to different depths.

FIG. 1 shows multiple arrows or laser beams 121, . . . , 125 at once. However, this is only for visualization purposes. In reality, according to the method described herein, this is a single laser beam that is guided across the substrate stack 100 in multiple passes, wherein the penetration depth of the focal point is varied in each pass. The expression "each pass" is to be understood in such a way that the focal point is set to different penetration depths in different passes for the purpose of an efficient method flow. However, it is obvious that passes with the same penetration depth of the focal point may be repeated at any time. Thus, multiple subsequent passes being carried out with the same penetration depth of the focal point is also included in the protective scope of the claims.

The laser beam 121, . . . , 125 is guided laterally (i.e. in parallel to the substrate plane) across the substrate stack 100. For example, in a first pass, the focal point may be set to be relatively deep, e.g. in such a way that the focal point penetrates the substrate stack 100 as deep as possible. For example, this is illustrated by the arrow 125 symbolizing the corresponding laser beam.

The energy of the laser is collimated in the focal point of the laser beam 125. This generates microcracks in the substrate stack 100 in the focal point. Due to laterally guiding the laser beam 125, a lateral row or chain of microcracks is generated in the focal point of the laser beam 125, which is illustrated on the basis of the dotted line 135 in this example. During a single pass, the focal point remains set at the same height. This generates in the substrate stack 100 a lateral row of microcracks 135 extending in parallel to the substrate plane in each pass.

In a second pass, the penetration depth of the focal point of the laser beam may then be set one step (or stage or level) higher so that the focal point penetrates the substrate stack 100 less deep and accordingly generates a further row of microcracks in the substrate stack 100 at a shallower depth. This is exemplarily shown on the basis of the arrow 124 generating the higher row, symbolized with dotted lines 134, of microcracks in the substrate stack 100.

In a last pass, the penetration depth of the laser beam can be set so that the focal point is as close as possible to the first, or upper, substrate surface 110. This is exemplarily symbolized by the arrow 121 generating the uppermost row, symbolized with dotted lines 131, of microcracks in the substrate stack 100.

Laterally guiding the laser beam with a varying penetration depth of the respective focal point multiple times may be carried out in multiple passes. These passes are also referred to as laser passes. Here, they are exemplarily illustrated by the arrow 140. Now, if the laser beam is guided across the substrate stack 100 in multiple passes, while varying the penetration depth of the focal point in each pass, the microcracks may be accordingly generated in steps (or stages), i.e. multiple laterally extending rows of microcracks vertically arranged above each other are formed. This is symbolized by the dotted lines 131, . . . , 135 arranged on top of each other.

It is up to the process optimization to select in which sequence the penetration depth of the focal point is varied. Thus, the laser passes may also be carried out gradually from low penetration depths, e.g. from the symbolic dotted line 131, to great penetration depths, e.g. towards the symbolic dotted line 135.

The variation of the focal point may be carried out up to a maximum penetration depth that is determined on the basis of the laser power and/or the material characteristics of the substrate stack 100. FIG. 1 exemplarily illustrates a laser beam with a maximum penetration depth on the basis of the arrow 125. That is, the microcracks may also be generated only up to this maximum penetration depth, which is in turn illustrated by the dotted line 135.

As initially mentioned, the maximum penetration depth may depend on the power of the laser and/or the material properties of the substrate stack 100. For example, a larger number of intermediate layers or interfaces 104 has a negative effect on the maximum penetration depth. Interfaces made of air may be particularly problematic. However, reflecting layers 104 also decrease the maximum penetration depth of the focal point of the laser beam 125. Thus, metal layers or oxide layers in the substrate stack 100 are not beneficial for a large maximum penetration depth.

As can be seen, the maximum penetration depth of the laser beam 125 is usually sufficient to provide individual substrate layers 101 within a substrate stack 100 with microcracks across their entire layer thickness. This is particularly the case for substrate layers with standardized layer thicknesses. As can be seen in FIG. 1, for example, the first substrate layer 101 may be fully provided with microcracks 131, . . . , 133.

However, if a substrate stack 100 including multiple individual substrate layers 101, 102, 103 is to be processed, the maximum penetration depth might possibly not reach down to the opposite lower substrate surface 120. In some cases, the maximum penetration depth of the laser beam might possibly not even reach to the center of the substrate stack 100, as is exemplarily indicated in FIG. 1.

Figure 2A:
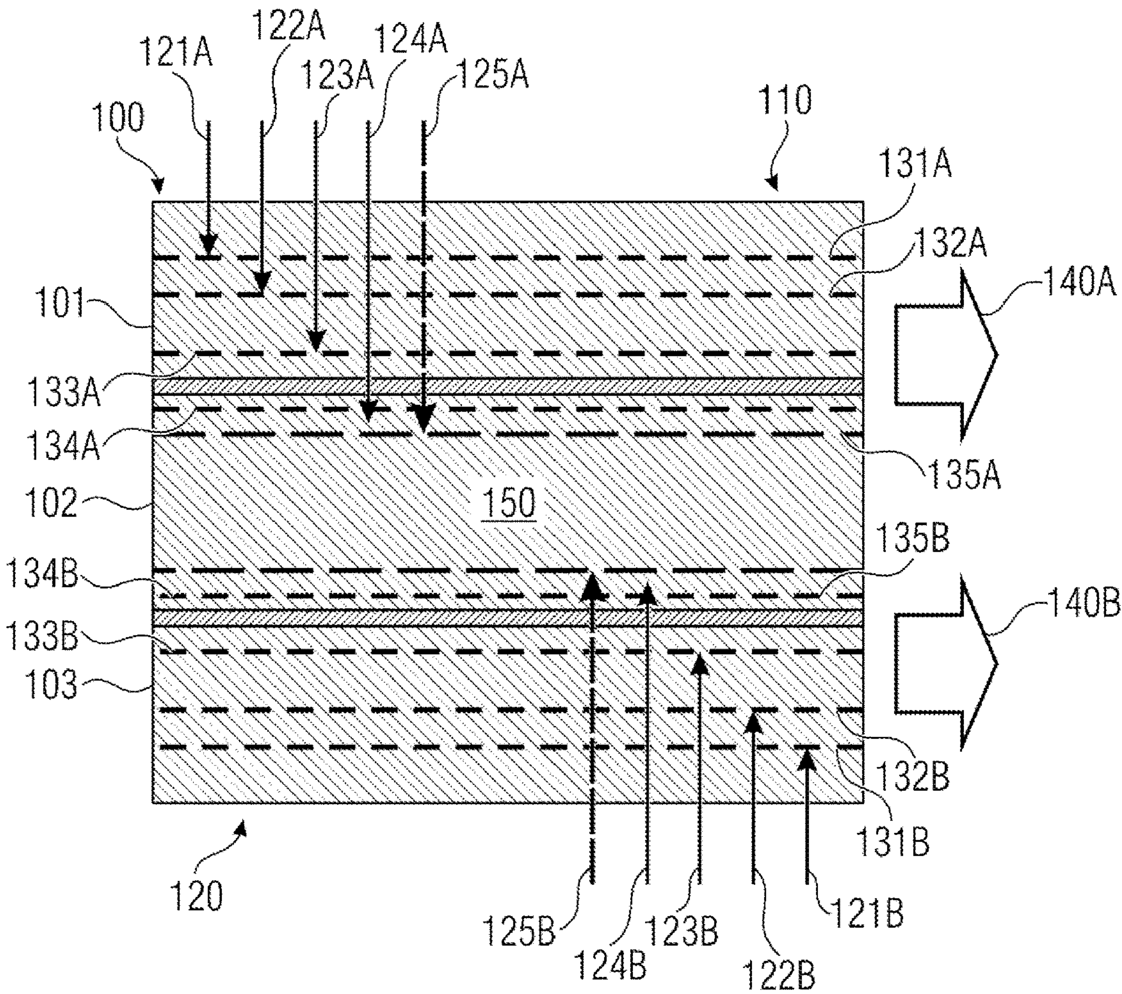
FIG. 2A shows a schematic lateral cross-sectional view of a substrate stack processed using a two-sided laser-based singulating method according to related technology.

FIG. 2A shows a solution approach as proposed in the related technology. Here, the substrate stack 100 is laser-processed on both sides, i.e. the laser beam is introduced into the substrate stack 100 from both opposite outer substrate stack surfaces 110, 120. Thus, similar to FIG. 1, multiple laser passes 140*a* are performed, wherein the laser beam 121*a*, . . . , 125*a* is laterally guided across the upper substrate stack surface 110, with the penetration depth of the focal point being varied in each pass. Additionally, multiple laser passes 140*b* are performed, wherein the laser beam 121*b*, . . . , 125*b* is laterally guided across the lower substrate stack at surface 120, with the penetration depth of the focal point also being varied in each pass.

As can be seen in FIG. 2A, the laser beam 125A penetrating the first substrate stack surface 110 includes a maximum penetration depth that does not reach all the way to the center of the substrate stack 100. The laser beam 125 penetrating the opposite second substrate stack surface 120 also includes a maximum penetration depth that does not reach all the way to the center of the substrate stack 100. Thus, in the center of the substrate stack 100, a region 150 in which the laser pass cannot be performed and microcracks can therefore not be generated is left out. With this method, the substrate stack 100 cannot be fully perforated with microcracks across the entire substrate stack thickness.

Figure 2B:
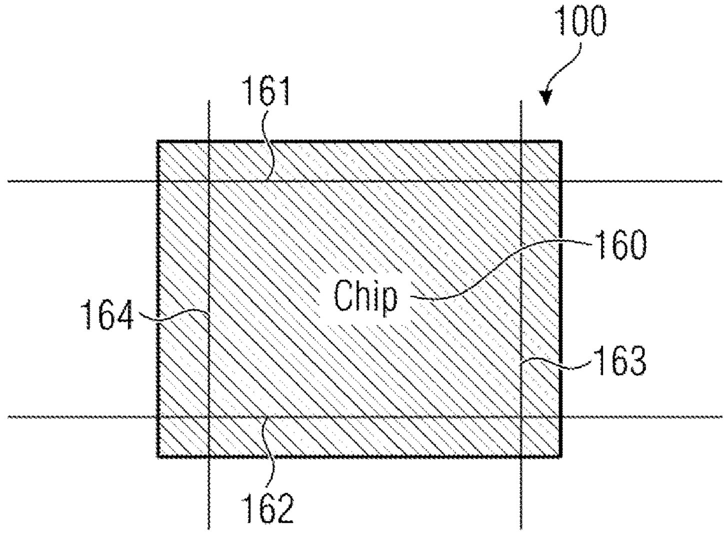
FIG. 2B shows a schematic top view of the substrate stack of FIG. 2A.

FIG. 2B shows a schematic top view of the substrate stack 100 of FIG. 2A. Here, as an example only, the substrate stack 100 includes a single chip region or a single microchip 160 that is laterally surrounded by multiple singulating scribe lines 161, . . . , 162. In practice, the substrate stack 100 will usually be a multi-layer wafer having formed thereon side by side a multitude of such microchips 160. As will be described in more detail in the following, the microchips 160 may be singulated along the generated singulating scribe lines 161, . . . , 162.

If the microchip 160 is an MEMS microchip, the same may include one or multiple MEMS elements. In the case of an IC microchip 160, it may include one or multiple electronic components. The top view illustrated in FIG. 2B shows singulating scribe lines 161, . . . , 164 laterally surrounding the microchip 160. These singulating scribe lines 161, . . . , 164 are formed from the above-described rows of microcracks arranged in steps one above the other (cf. FIG. 2A, reference numerals 131A, 135A as well as 131B, . . . , 135B).

Guiding the laser beam across the substrate stack 100 in a grid pattern results in singulating scribe lines 161, . . . , 162 arranged in a grid shaped manner and each extending laterally around the microchip 160. The singulating scribe lines 161, . . . , 164 act as a type of perforation along which the microchips 160 can later be singulated, i.e. released from the substrate stack 100. To this end, the singulating scribe lines 161, . . . , 164 are mechanically broken open so that the microchip 160 can be broken out of the substrate stack 100, so to speak.

However, if the substrate stack 100, as shown in FIG. 2A, is not perforated with microcracks 131A, 135A; 131B, . . . , 135B across the entire substrate stack thickness, this may lead to unclean fracture edges that have to be mechanically post-processed afterwards. However, mechanical post-processing can lead to damage on the microchip, which can be particularly critical in case of sensitive MEMS components.

To solve this problem, the disclosure proposes to structure the substrate 100 by generating one or multiple recesses. When generating the recesses, substrate material is removed so that the substrate thickness is reduced at this location. Through this, the focal point of the laser beam may accordingly penetrate deeper into the substrate 100 at this location. Embodiments are subsequently described in more detail with reference to FIG. 3A to 5B.

Figure 3A:
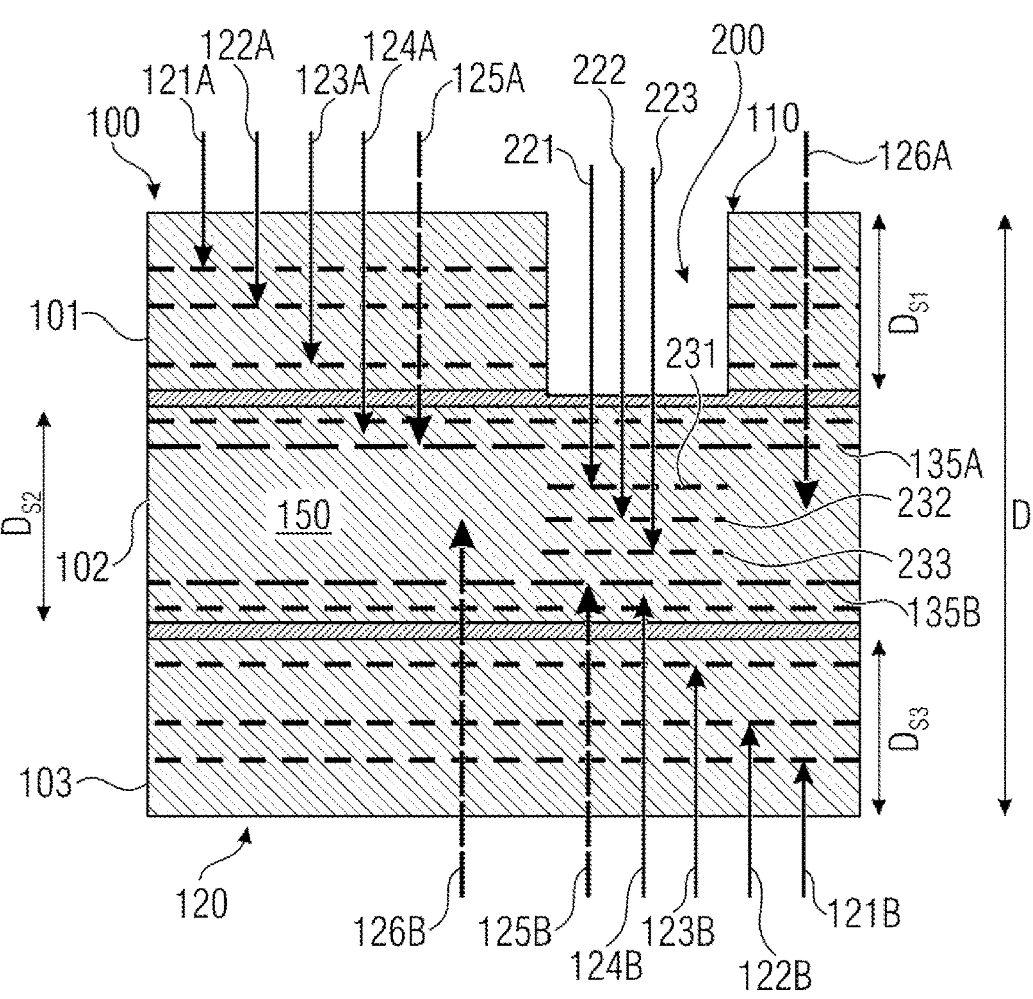
FIG. 3A shows a schematic lateral cross-sectional view of a substrate stack processed using a laser-based singulating method according to an embodiment of the disclosure.

FIG. 3A first shows a substrate 100 configured in the form of multi-layer substrate stack 100, similar to the above-discussed substrate stacks 100. The same or similar features with the same or similar structures and/or functions are provided with the same reference numerals. In all of the embodiments described herein, the substrate 100 may also be a single-layer substrate. This single substrate 100 may have a substrate thickness of more than 700 μm, for example. If the single substrate 100 has a substrate thickness of more than 1400 μm, it may be processed only partially with the above-described two-sided laser separation method according the related technology. The same also applies to a single substrate that might be thinner, however, that can only be poorly penetrated by the laser due to certain incorporated layers (e.g. oxide layers).

One difference to the above-described substrates 100 consists, among other things, of the fact that the substrate 100 illustrated in FIG. 3A includes, according to the disclosure, at least one recess 200. The recess 200 is structured vertically into the substrate 100, which is why the recess 200 will in the following sometimes also be referred to as depression.

As an example only, the substrate 100 is here configured in a form of multi-layer substrate stack. Initially, the first substrate layer 101 may have a substrate layer thickness $D_{S1}$, the second substrate 102 may have a substrate layer thickness $D_{S2}$ and the third substrate layer 103 may have a substrate layer thickness $D_{S3}$. The substrate layer thicknesses $D_{S1}$, $D_{S2}$, $D_{S3}$ may be equal or may differ from each other. Thus, the entire substrate stack 100 has a substrate thickness or substrate stack thickness D calculated from the sum of the substrate layer thicknesses $D_{S1}$. $D_{S2}$, $D_{S3}$ of the individual substrate layers 101, 102, 103.

Similar as with the substrate stack 100 discussed with reference to FIG. 2A, the substrate stack thickness D of the substrate stack 100 in the embodiment shown in FIG. 3A is also larger than the maximum penetration depth of the focal point of the laser beam 125A, 125B so that the microcracks 131A, . . . , 135A; 131B, . . . , 135B can only be generated within the substrate stack 100 to a certain depth. This certain depth or the maximum penetration depth of the laser beam 125A, 125B may be less than half of the substrate stack thickness, i.e. $<D/2$.

In FIG. 3A, this is illustrated by the arrows 126A, 126B. For example, the arrow 126A symbolizes the distances between the first substrate stack surface 110 and the half of the, or the center of the substrate 100. As can be seen, in laser processing from the first substrate surface 110, even the deepest setting of the focal point (arrow 125A) is not sufficient to reach the center of the substrate 100. On the other hand, the arrow 126B symbolizes the distance between the second substrate surface 120 and half of the, or the center of the substrate 100. As can be seen, in laser processing from the second substrate 120, even the deepest setting of the focal point (arrow 125B) is not sufficient to reach the center of the substrate 100.

To solve this problem, according to the disclosure, at least one depression 200 is structured into at least one of the two substrate surfaces 110, 120. The depression 200 is generated using subtractive manufacturing techniques, i.e. substrate material is removed from the substrate 100. For example, this is may be done by using suitable etching methods. Due to the material removal, the substrate thickness D, to be measured in the laser beam direction, of the substrate 100 is accordingly reduced at the location of the depression 200.

As shown in the non-limiting embodiment of FIG. 3A, the substrate 100 may be structured only on one side. That is, the recess 200 is structured only into one of the two substrate surfaces 110, 120. In other embodiments, (e.g. FIG. 4A), the substrate 100 may also be structured on both sides. That is, the recess 200 is structured in the first and second substrate surfaces 110, 120. From the respective structured substrate surface 110, 120, the recess 200 extends vertically towards the inside in the direction of the center of the substrate 100.

As exemplarily illustrated in FIG. 3A, for example, the depression 200 is structured only into the first substrate surface 110. In the case of a substrate stack 100, for example, the depression 200 may extend across the entire substrate layer thickness $D_{S1}$ of the first substrate layer 101. Alternatively, the depression 200 could be generated only on the opposite second substrate surface 120, wherein the depression 200 could extend vertically across the entire substrate layer thickness $D_{S3}$ of the third substrate layer 103. That is, the depression 200 may extend vertically completely through precisely one of the substrate layers 101, 102, 103 of the substrate stack 100. However, it would also be conceivable that the recess 200 extends only partially, i.e. not completely, through precisely one of the substrate layers 101, 102, 103 of the substrate stack 100.

In the case of a single substrate 100, the recess 200 may extend from the first substrate surface 110 vertically into the substrate 100 by less than half of the substrate thickness D. That is, the recess 200 is only deep enough so that it does not fully each halfway into the substrate 100. The same applies for a recess 200 structured into the second substrate surface 120.

The depth of the recess 200 ultimately depends, among other things, on the desired maximum penetration depth of the laser beam. The deeper the recess 200, the deeper the laser beam can ultimately penetrate the substrate 100. This will be described in more detail in the following.

That is, according to the disclosure, the recess 200 is structured into substrate 100 before generating the microcracks or singulating scribe lines 161, . . . , 164. That is, the recess 200 is generated where the laser beam is later guided along so as to generate the microcracks or singulating scribe lines 161, . . . , 164 at these locations. That is, the recess 200 is placed precisely into the later trajectory of the laser beam so that the recess 200 extends coaxially (in the top view) to at least one of the subsequently generated singulating stripe lines 161, . . . , 164, as exemplarily illustrated in the top view illustrated in FIG. 3B.

When generating the singulating scribe lines 161, . . . , 164, the laser beam can now not only be guided laterally across the respective substrate surface 110, 120, but also laterally across the depression 200 structured into the respective substrate surface 110, 120. In this case, the laser beam initially enters the depression 200 without obstacles, wherein the laser beam does not lose any energy. It is only at the bottom of the depression 200 that the laser beam then meets the substrate 200. This is symbolized by the arrows 221, 222, 223. Here, each arrow 221, 222, 223 again represents one pass (laser pass) with a different penetration depth of the focal point. As can be seen, despite the same laser power, the focal point (arrowhead) of the respective laser beam 221, 222, 223 penetrates deeper into the substrate 100 at the location of the depression 200 compared to a substrate portion that does not include such a depression.

Since substrate material was removed in the area of the depression 200, the focal point 231, 232, 233 of the respective laser beam 221, 222, 223 is located further in the interior of the substrate 100. In the case of a substrate stack 100, e.g., the focal point 231, 232, 233 of the respective laser beam 221, 222, 223 meets the respective substrate layer (here substrate layer 102) further down, i.e. within the substrate stack 100. Accordingly, the maximum depression depth of the laser beam may be extended by the depth of the recess 200. That is, the deeper the recess 200 is structured into the substrate 100 or the substrate stack 100, the deeper the focal point of the laser beam may penetrate into the substrate 100 or into the substrate stack 100 at this location. Thus, among other things, the depth of the recess 200 is ultimately determined by the desired maximum penetration depth of the laser beam.

As can also be seen in FIG. 3A, the substrate 100 may be processed with the laser on both sides so as to generate the microcracks in the substrate 100. The maximum penetration depth of the laser beam that may be achieved from the first substrate surface 110 is indicated by the arrow 125A. The deepest microcrack row that can be generated therewith is indicated by the reference numeral 135A. The maximum penetration depth of the laser beam that can be achieved from the second substrate surface 120 is indicated by the arrow 125B. The deepest microcrack row that can be generated therewith is indicated by the reference numeral 135B.

The laser beam passing through the recess 200 with the maximum achievable penetration depth is indicated by the arrow 223. The deepest microcrack row that can be generated therewith is indicated by the reference numeral 233. In this case, the recess 200 can be structured into the first substrate surface 110 to such a depth that the laser beam 223 almost reaches the deepest microcrack row 135B that can be generated from the opposite second substrate surface 120. Thus, the deepest microcrack row 223 that can be generated through the recess 200 (in the vertical direction 200) can be immediately adjacent to the deepest microcrack row 135B (in the vertical direction) that can be generated from the opposite second substrate surface 120. Through this, substrate 100 may be fully perforated with microcracks across the entire remaining substrate thickness at this location, i.e. in the area of the recess 200. That is, there is no region 150 left in the area of the recess 200 in which microcracks could otherwise not be generated (due to the limited maximum penetration depth).

Thus, with the present disclosure, microcracks can now also be generated in the region 150 in which microcracks could previously not be generated (cf. e.g. FIG. 2A) due to the insufficient maximum penetration depth of the laser beam. These microcracks are symbolized with dotted lines 231, 232, 233. In this case, the microcracks 231, 232, 233 may be generated across the entire lateral expansion (length or width) of the depression 200 so that the microcracks 231, 232, 233 in the substrate 100 are each precisely located opposite the depression 200. That is, when laterally guiding the laser beam 221, 222, 223, the microcracks 231, 232, 233 may be generated across the entire length (or width) of the recess 200. This can be seen in FIG. 3A by the microcracks 231, 232, 233 including the same lateral dimensions as the recess 200.

However, the maximum penetration depth of the laser beam still remains limited at the locations where no recess 200 is structured into the substrate stack 100 (cf. arrows 125A, 125B) so that microcracks are still not configured in this region 150 within the substrate 100.

Figure 3B:
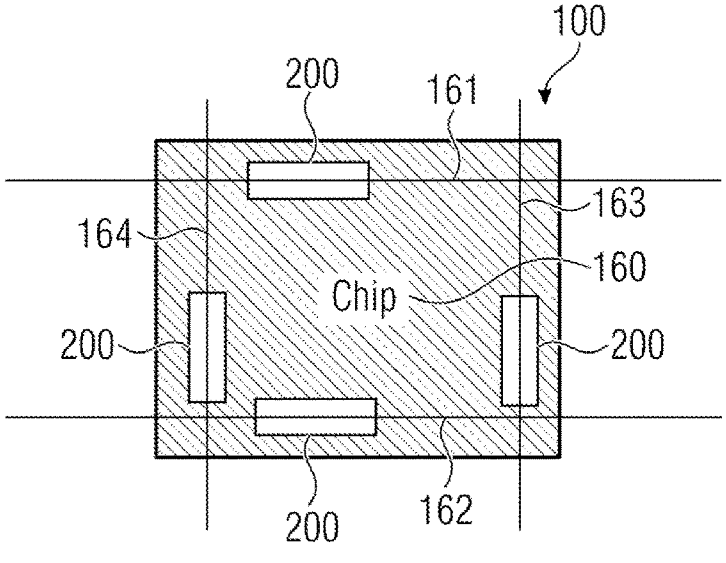
FIG. 3B shows a schematic top view of the substrate stack of FIG. 3A.

As can be seen in the top view illustrated in FIG. 3B, the at least one recess 200 extends at least partially in the lateral direction along precisely one of the singulating scribe lines 161, . . . , 164. As an example only, FIG. 3B shows that one recess 200 each may extend along precisely one of the singulating scribe lines 161, . . . , 164.

More generally speaking, at least one recess 200 each may extend along precisely one singulating scribe line 161, . . . , 164. Thus, it would be conceivable that only a single recess 200 extends along a single singulating scribe line 161, . . . , 164. However, it would also be conceivable that there are two recesses 200, with each of these two recesses 200 extending along a different singulating scribe line 161, . . . , 164. For example, the two recesses 200 could be arranged opposite each another, i.e. a first recess 200 could extend along the first singulating scribe line 161, while a second recess 200 could extend along the opposite second singulating scribe line 162, for example. However, it would also be conceivable that there are three or four recesses 200, with each of these recesses 200 extending along a different singulating scribe line 161, . . . , 164.

As initially mentioned, each recess 200 may extend at least partially along a singulating scribe line 161, . . . , 164. That is, the recess 200 does not extend (in a lateral direction) across the entire length of a singulating scribe line 161, . . . , 164, but only across a part or portion, e.g. half of the length, of a singulating scribe line 161, . . . , 164.

As can be seen in FIG. 3B to this end, the recess 200 may be configured in the form of an elongated trench structure that extends at least partially in the lateral direction (e.g. across half of the length of a singulating scribe line) along the respective singulating scribe line 161, . . . , 164.

However, it would also be conceivable that the recess 200 extends in the lateral direction fully across the entire length of a singulating scribe line 161, . . . , 164. In this case, for stability reasons, it would make sense if the fully extending recesses 200 would not be provided at all four singulating scribe lines 161, . . . , 164 at the same time, but only at two opposite singulating scribe lines 161, . . . , 164, for example.

As mentioned above, the depth of the recess 200 is determined according to the desired maximum penetration depth of the laser beam, among other things. With reference to FIG. 3A, it would also be conceivable in principle, e.g., that the recess 200 extends to such a depth into the substrate 100 that the laser beam 221, 222, 223 passing through the recess 200 reaches down to the second substrate surface 120. In this way, the substrate stack 100 could also be perforated fully across the entire remaining substrate thickness. In this case, it would not be necessary to process the second substrate surface 120 with the laser. However, in this case, a very deep recess 200 would have been generated, which could possibly lead to an undesired early breakout of the microchip 160.

Figure 4A:
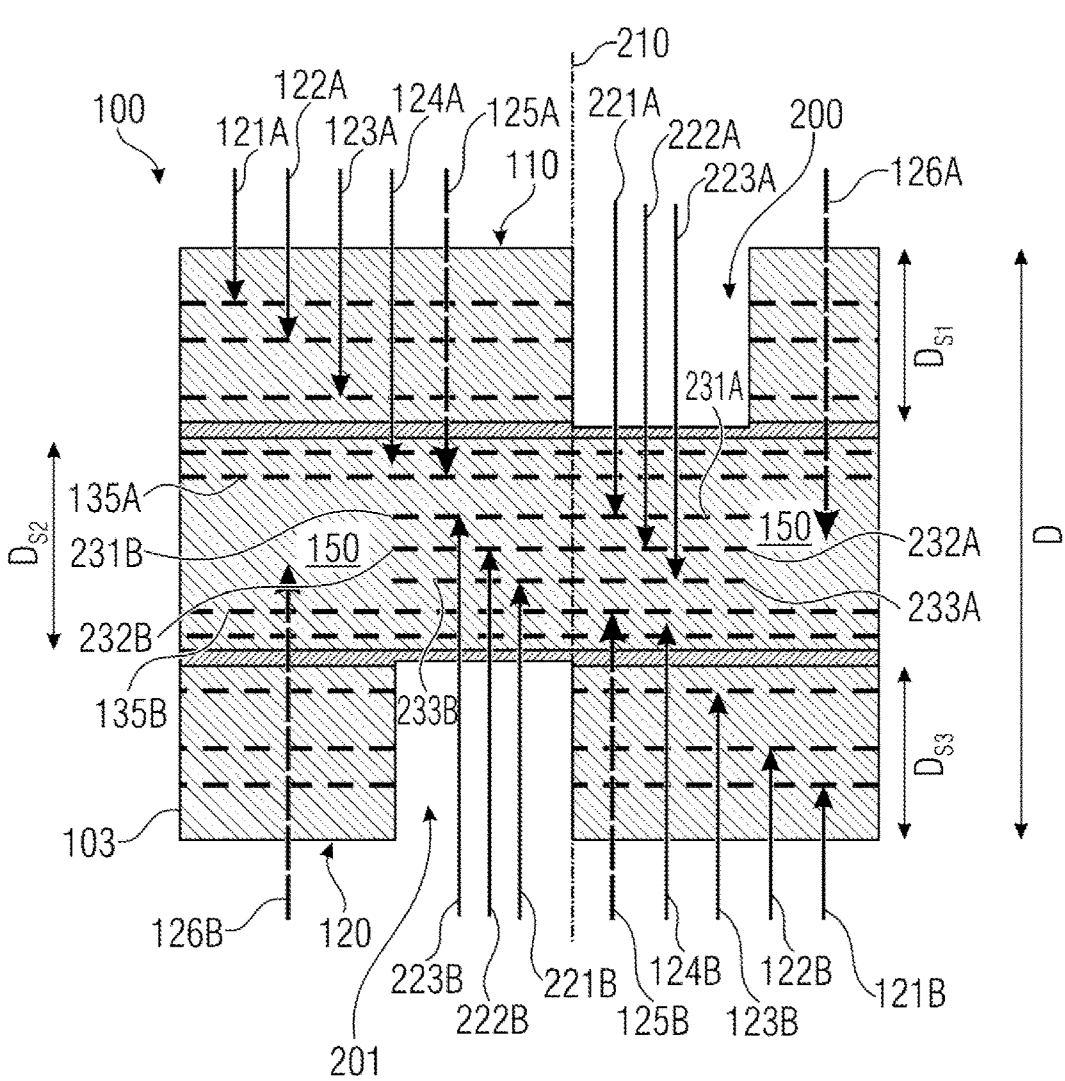
FIG. 4A shows a schematic lateral cross-sectional view of a substrate stack processed using a laser-based singulating method according to an embodiment of the disclosure.
Figure 4B:
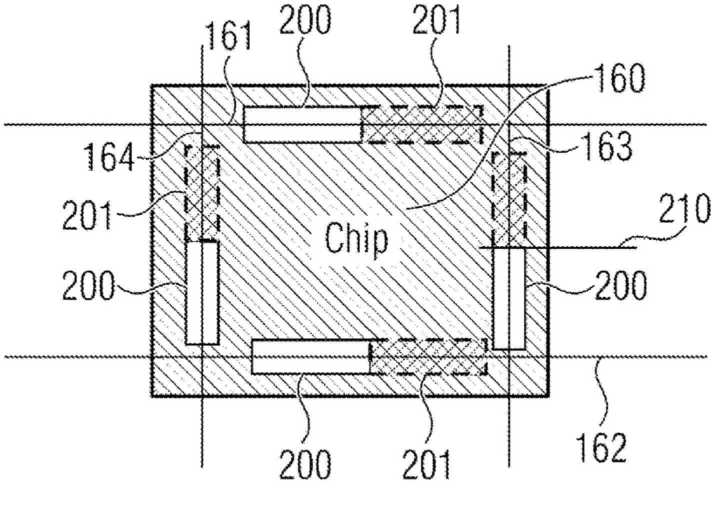
FIG. 4B shows a schematic top view of the substrate stack of FIG. 4A.

To solve this problem, a further embodiment shown in FIGS. 4A and 4B is provided. Here, the substrate 100 is structured on both sides, i.e. one or multiple recesses 200, 201 are structured into the first substrate surface 110 and into the opposite second substrate surface 120 each.

For example, a first recess 200 can be structured into the first substrate surface 110. In the case of a substrate stack 100, the recess 200 could also be structured into the first substrate layer 101, for example. A second recess 201 can be structured into the opposite second substrate surface 120. In the case of a substrate stack 100, the recess 200 could also be structured into the opposite third substrate layer 103, for example.

As an example only, FIG. 4A shows a substrate stack 100 with three substrate layers 101, 102, 103 arranged on top of each other. However, the method can also be performed if the substrate stack 100 includes only two substrate layers 101, 103 arranged on top of each other. If a further substrate layer 102 is to be arranged between the two outer substrate layers 101, 103, this middle substrate layer 102 may be configured without recesses, i.e. the intermediate substrate layer 102 may remain free of recesses.

The first and the second recess 200, 201 may each extend at least partially in the lateral direction along one of the singulating scribe lines 161, . . . , 164. As can be seen in FIG. 4, one recess 200 structured into the first substrate surface 110 each may extend partially along a singulating scribe line 161, . . . , 164 each. Alternatively or additionally, one recess 201 structured into the second substrate surface 120 each may extend partially along a singulating scribe line 161, . . . , 164 each.

Preferably, a first recess 200 structured into the first substrate surface 110 and a second recess 201 structured into the second substrate surface 120 may extend along one and the same singulating scribe line 161, . . . , 164. For example, the two recesses 200, 201 could extend along the singulating scribe line 161.

In some embodiments, the recesses 200, 201 may each extend across approximately half of the respective singulating scribe line 161, . . . , 164. As is exemplarily illustrated in the top view shown in FIG. 4B, e.g., the first recess 200 could extend (in the lateral direction) along a first half of the singulating scribe line 161, while the second recess 201 could extend (in the lateral direction) along the second half of the same singulating scribe line 161.

In this case, the first recess 200 structured into the first substrate surface 110 and the second recess 201 structured into the second substrate surface 120 could be laterally displaced with respect to each other (along the respective singulating scribe line 161, . . . , 164). In this case, the two recesses 200, 201 could be displaced with respect to each other such that they laterally border each other without overlapping. However, an overlap would be conceivable in principle. For example, the first recess 200 could end at an imaginary line 210, while the second recess 201 starts at this imaginary line 210 (cf. FIGS. 4A and 4B).

In this embodiment, the substrate 100 may also be processed with the laser on both sides. In this case, features with the same or similar structures or functions are again provided with the same reference numerals as in the previous figures.

It can be seen here again that the recesses 200, 201 on the first and the second substrate surface 110, 120 are each responsible for the laser beam 221A, 222A, 223A; 221B, 222B, 223B being able to deeper penetrate the substrate 100. Through this, the above-described microcracks 231A, 232A, 233A; 231B, 232B, 233B can be generated in the regions 150 which the laser beam would otherwise not be able to reach without the recesses 200, 201.

Thus, within the substrate 100, microcracks 231A, 232A, 233A; 231B, 232B, 233B may each be generated opposite the first recess 200 and opposite the second recess 201. If the two recesses 200, 201, as described above, laterally border each other (in a top view) (and are preferably equally deep), the microcracks 231A, 232A, 233A; 231B, 232B, 233B that can be generated by the respective depression 200, 201 may even border each other directly. For example, this can be seen in FIG. 4A at the transition along the imaginary separation line 210. The microcracks 231A, 232A, 233A that can be generated through the first recess 200 directly follow the microcracks 231B, 232B, 233B that can be generated through the second recess 201 at the same height. Through this, continuous rows of microcracks 231A+231B; 232A+232B; 233A+233B can be generated.

Figure 5A:
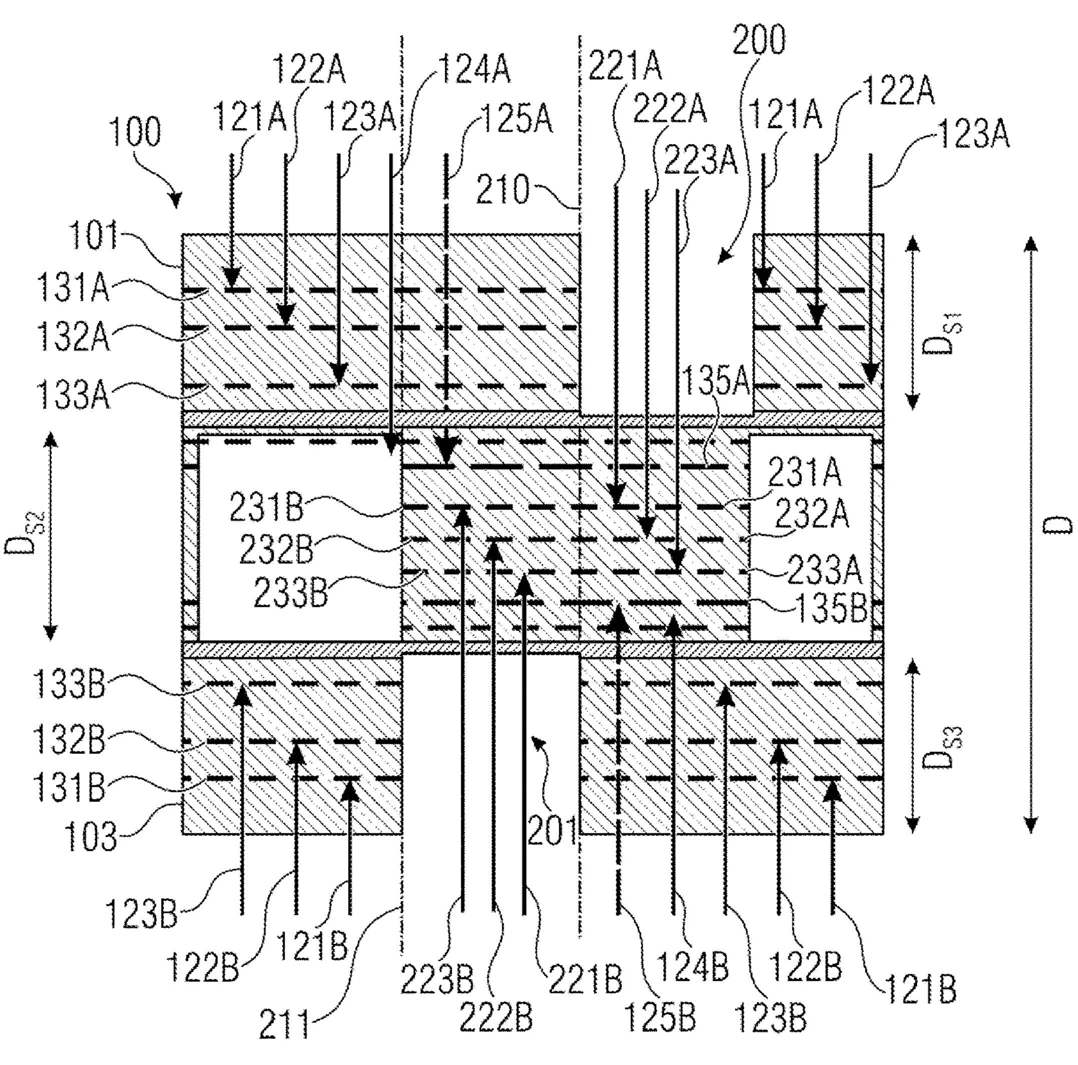
FIG. 5A shows a schematic lateral cross-sectional view of a substrate stack processed using a laser-based singulating method according to an embodiment of the disclosure.
Figure 5B:
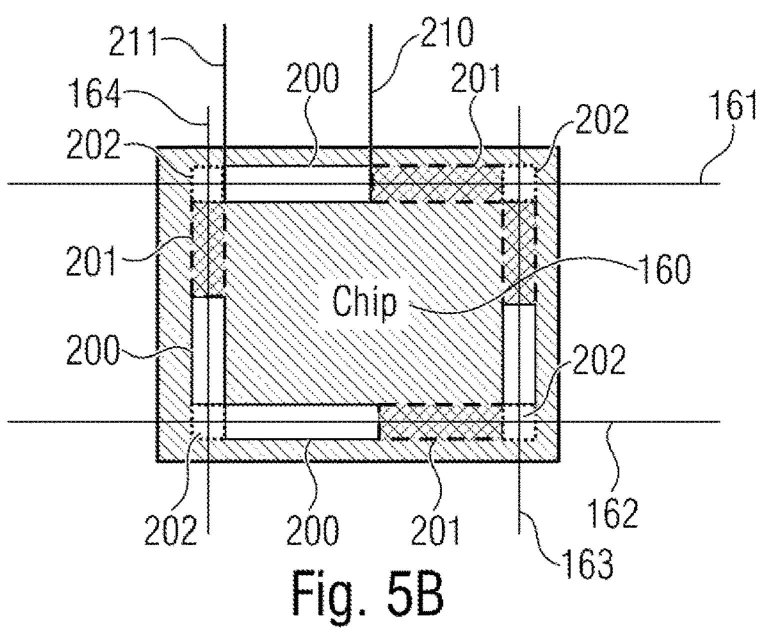
FIG. 5B shows a schematic top view of the substrate stack of FIG. 5A.

FIGS. 5A and 5B show a further embodiment. In this case, the same features with the same or similar structures or functions are again provided with the same reference numerals, as in the previous figures.

In this embodiment, the substrate 100, as illustrated, can also be structured on both sides, i.e. one or multiple recesses 200, 201 may each be structured into the first substrate surface 110 and into the opposite second substrate surface 120. In this embodiment, it is also conceivable that only one of the two substrate surfaces 110, 120 is structured.

According to the embodiment shown in FIG. 5, the substrate 100 is again exemplarily configured in the form of a multi-layer substrate stack with at least three substrate layers 101, 102, 103 arranged on top of each other. In this embodiment, a recess 202 is also structured in the second substrate layer 102 arranged between the first and third substrate layers 101, 103.

More generally speaking, according to this embodiment, a further recess 202 is structured within the substrate 100. In a multi-layer substrate stack 100, this further recess 202 may be structured, e.g., into an inside substrate layer, e.g. into the intermediate second substrate layer 102. Additionally, as described above, one recess 200, 201 each may be structured into the first and/or second substrate surface 110, 120. In the case of a substrate stack 100, e.g. one recess 200, 201 each may be structured into at least one of the adjacent outer substrate layers, e.g. into the first substrate layer 101 and/or into the third substrate layer 103.

All recesses 200, 201, 202 in the substrate 100, e.g. the recess 200 structured in the first substrate layer 101 and the recess 202 structured in the second substrate layer 102 and the recess 201 structured in the third substrate layer 103, may all each extend at least partially in the lateral direction along one of the singulating scribe lines 161, . . . , 164.

As can exemplarily be seen in FIG. 5B, a recess 200 structured into the first substrate surface 110 or into the first substrate layer 101 may extend partially along one singulating scribe line 161, . . . , 164 each. Alternatively or additionally, a recess 202 structured into the interior of the substrate 100, e.g. structured into the second substrate layer 102, may extend partially along one singulating scribe line 161, . . . , 164 each. In addition, alternatively or additionally, a recess 201 structured into the second substrate surface 120 or into the third substrate layer 103 may extend partially along one singulating scribe line 161, 164 each.

Preferably, all three recesses 200, 201, 202 may each extend along one and the same singulating scribe line 161, . . . , 164. For example, all three recesses 200, 201, 202 could extend along the singulating scribe line 161, . . . , 164.

As is exemplarily illustrated in FIG. 5B, the recess 202 structured in the interior of the substrate 100, e.g. in the second substrate layer 102, could be located at a corner at which two orthogonally extending singulating scribe lines 161, . . . , 164 intersect. For example, the recess 202 structured in the second substrate layer 102 could be located at a corner at which the first singulating scribe line 161 and the third singulating scribe line 163 intersect. On the opposite side, i.e. at the intersection of the first and the fourth singulating scribe lines 161, 164, a further recess 202 that may also be structured into the second substrate layer 102 could be arranged.

The individual recesses 200, 201, 202 may have an essentially rectangular cross-section. For example, the recesses may have an elongated rectangular cross-section (in a top view), as exemplarily illustrated by the recesses 200, 201. Alternatively, the recesses may have a square cross-section (in the top view), as exemplarily illustrated by the recesses 202 arranged in the corner.

All three recesses 200, 201, 202 may be displaced laterally with respect to each other (along the respective singulating scribe line 161 . . . 164). The three recesses 200, 201, 202 may be displaced with respect to each other such that they laterally border each other without overlapping. However, an overlap would be conceivable in principle. For example, the first recess 200 could end at a first imaginary line 210, while the second recess 201 starts at this first imaginary line 210. In addition, the second recess 201 could end at a second imaginary line 211, while the third recess 200 starts at this second imaginary line 211.

Through this, microcracks 231A, 232A, 233A; 231B, 232B, 233B can now be generated in the region 150 (cf. FIGS. 2A, 3A and 4A) in which microcracks could otherwise not be generated without the recesses 200, 201, as described above with reference to FIGS. 4A and 4B. However, as could be seen in FIG. 4A, parts of the region 150 without microcracks still remained, in particular at the positions where there were no recesses 200, 201. In the embodiment shown in FIG. 5A, these parts of the region 150 without microcracks could be bridged with the recesses 202 structured in the interior of the substrate 100. Thus, there are microcracks 231A, 232A, 233A; 231B, 232B, 233B and recesses 202 in the interior of the substrate 100 (e.g. in the intermediate second substrate layer 102). In this case, the microcracks 231A, 232A, 233A; 231B, 232B, 233B can seamlessly border the recesses 202 (in the lateral direction).

Through this, the substrate 100 is perforated across the entire substrate thickness, both using the microcracks 231A, 232A, 233A; 231B, 232B, 233B and using the adjacent recesses 202. As mentioned initially, all microcracks 131A, . . . , 134A; 131B, . . . , 134B; 231A, 232A, 233A; 231B, 232B, 233B generated in the substrate 100 and all recesses 200, 201, 202 structured in the substrate 100 extend laterally along at least one singulating scribe line 161, . . . , 164. In this case, the singulating scribe lines 161, . . . , 164 are formed by the microcracks and the recesses.

Since the singulating scribe lines 161, . . . , 164 laterally surround the microchip 160, the microcracks and the recesses accordingly extend laterally around the microchip 160. This generated predetermined breaking points along which the microchip 160 can later be singulated efficiently.

Since the predetermined breaking points configured in the form of microcracks and recesses extend vertically through the entire substrate 100, the individual microchips 160 can be cleanly broken or singulated out of the substrate along the predetermined breaking points. That is, when singulating the microchips 160, there are clean or smooth fracture edges that do not need any further mechanical post-processing.

According to the disclosure, predetermined breaking points are generated in the scribe lines 161, 164 that vertically extend (i.e. orthogonal to the substrate plane) across multiple planes (or levels) (e.g. across multiple substrate layers 101, 102, 103) in the substrate 100. In the lateral or horizontal direction (i.e. in parallel to the substrate plane), the predetermined breaking points are displaced with respect to each other, wherein they may border each other. Thus, in a top view, a continuous singulating scribe line that is divided into multiple segments distributed vertically across multiple planes is generated. The individual scribe line segments may either include microcracks or recesses.

Subsequently, the present disclosure will be summarized once more:

The disclosure concerns to any substrates 100 (e.g. vertical layer stacks) whose (lateral) singulating is impeded due to the thickness and quality (layer sequence, materials) and can be efficiently and effectively performed with the present concept as disclosed.

In the field of MEMS, the microchips 160 to be singulated may contain components such as sound transducers (e.g. microphones and loudspeakers) for acoustic waves in the infrasound range, in the audible range, or in the ultrasound range. Such components may additionally include microfluidic components such as pressure sensors, micropumps and/or microvalves. In addition, the possible application cases extend to positioning platforms, tilt and stoke mirrors, varactor diodes, mirror matrices, inertia sensors (gyroscopes, acceleration sensors, magnetic field sensors) as well as to terahertz modulators and micro-spectrometers (optical and ion mobility spectrometers).

Non-MEMS components may be layer systems such as fibre-reinforced composite layers (CFK, GFK), metallic layer systems and non-metallic layer systems (ceramics, plastic).

The MEMS components 160 described herein may be configured in a substrate 100, e.g. in the form of a layer stack. The substrate 100 or the substrate stack 100 may additionally include a substrate layer 102 (also device plane) in which the electrodes or passive elements may be arranged. For example, further substrate layers 101, 103 concern a bottom 103, which may also be referred to as handling wafer, and a cap 101, which may also be referred to as a cap wafer. The cap and the handling wafers 101, 103 are connected to the middle substrate layer (device plane) 102 via bonding methods, preferably wafer bonding, which is why acoustically sealed spaces can be formed in the component 160. In these spaces, which may be formed in the device plane 102, deformable components or MEMS structures may be deformed, i.e. the deformation takes place in plane.

The individual substrate layers 101, 102, 103 may include electrically conductive materials, e.g. doped semiconductor materials and/or metal materials. Arranging electrically conductive layers 101, 102, 103 in layers enables a simple implementation since selective release from the respective layer 101, 102, 103 enables forming electrodes (e.g. for deflectable elements) and passive elements. If electrically non-conductive materials are desired, their application in layers may be done using deposition, for example.

An embodiment of the disclosure is to improve laser-based singulating methods so as to enable an effective water-free separation of individual chips 160 from a wafer stack (substrate or layer stack 100). The separation or singulating is most effective if laser passes are possible across the entire depth of the substrate 100. In other words, the laser may generate rows or chains of microcracks 131A, . . . , 135A; 131B, . . . , 135B; 231A, . . . , 233A; 231B, . . . , 233B across the entire depth or substrate thickness D. To this end, design rules that enable a deeper penetration of the layer into the substrate 100 (compared to previous laser-based singulating methods) so as to generate singulating scribe lines 161, . . . , 164 extending across the entire substrate stack thickness D are defined. Thus, it is possible to generate singulating scribe lines 161, . . . , 164 across the entire depth of the substrate 100. Such rules are of particular importance if the thickness of the substrate is approximately 1-2 mm so that the laser beam cannot penetrate deep enough or if the substrate 100 would theoretically be thin enough to be able to be processed with the laser, but the substrate 100 is poorly penetrable by the laser due to its structure (e.g. multiple oxide layers or the like). Furthermore, such rules may be of importance if the substrate 100 is configured in the form of a multi-layer substrate stack 100 with two or multiple bonded standard substrates 101, 102, 103.

An embodiment of the disclosure is to perform an intelligent structuring of the substrate 100 so that the laser beam can generate, after wafer bonding, multiple microcrack rows arranged in steps (in the vertical direction) across the entire depth of the substrate 100 as well as along the entire chip circumference in an effective way and without interruption. This enables a clean laser separation of the substrate 100 or of compound (bonded) substrates 101, 102, 103 in a substrate stack. The width of the sawing lane can also be reduced, e.g. to less than 0.4*substrate thickness.

In the embodiment shown in FIGS. 3A and 3B, the exemplarily shown substrate stack 100 includes at least two bonded individual substrates or substrate layers 101, 102. In FIGS. 3A and 3B, a total of three bonded individual substrates 101, 102, 103 are depicted, as an example only. The individual substrate 101, 102, 103 are locally structured (partially structured) by structuring a recess 200 into precisely one substrate surface 110, 120 (i.e. into precisely one of the outer substrates 101, 103). This enables the laser beam to penetrate deep(er) into the substrate stack 100 at this location, compared to locations where no recess 200 is structured into the substrate stack 100.

In the embodiment shown in FIGS. 4A and 4B, one recess 200, 201 each is structured into both substrate surfaces 110, 120 (or into both outer individual substrates 101, 103) so that the laser beam is able to locally penetrate deep(er) again. The two recesses 200, 201 may be displaced laterally with respect to each other. This makes it possible that the microcracks 231A, . . . , 233A generated using the laser beam through the first recess 200 (laterally) border the microcracks 231B, . . . 233B generated through the second recess 201. Thus, longer rows of microcracks are generated in the region 150.

In the embodiment shown in FIGS. 5A and 5B, a recess 202 is additionally generated in the middle substrate 102. The individual substrates 101, 102, 103 may also be structured so as to be displaced with respect to each other. Through this, the generation of faults (microcracks or recesses 202) is ensured in the scribe line at all locations of the substrates 101, 102, 103.

The method proposed herein includes at least one of the following advantages:

- One or multiple individual substrates 101, 102, 103 within a substrate stack 100 may be structured locally, and optionally (laterally) displaced or not displaced, so as to achieve laser passes 140 across the entire depth of the substrate stack 100 without interruptions when laser-processing one or two substrate stack surfaces 110, 120.
- The individual substrates 101, 102, 103 may be structured continuously (substrate is fully structured: e.g. 400 μm of 400 μm) or structured partially (e.g. 100-300 μm of 400 μm).
- Structuring the substrate 101, 102, 103 may take place along all four laterally surrounding sides/edges of the chip 160, or only along one to three sides.
- Depending on the design, the individual substrates 101, 102, 103 may be structured at different sides/edges.
- The process with a concentrated radiation energy input (e.g. laser) may be carried out from multiple directions (e.g. front side or first substrate stack surface 110 and/or rear side or second substrate stack surface 120).

In the following, additional embodiments and aspects of the disclosure will be described which can be used individually or in combination with any of the features and functionalities and details described herein.

A first aspect may have a method for singulating microchips 160, the method including: providing a single-layer or multi-layer substrate 100, laser-based creating microcracks 131, . . . , 135 in the substrate 100 using a laser beam 121, . . . 125 that penetrates the substrate 100, wherein the laser beam 121, . . . , 125 is guided laterally around the microchips 160 so as to generate singulating scribe lines 161, . . . , 164 in the substrate 100 along which the microchips 160 are to be singulated, wherein the laser beam 121, . . . , 125 is guided laterally across the substrate 100 in multiple passes, wherein the focal point of the laser beam 121, . . . , 125 is set to a different penetration depth in each pass so that the microcracks 131, . . . , 135 created in the focal point are generated in the substrate 100 in a step-wise manner, and generating at least one recess 200 in the substrate 100, wherein the recess 200 extends at least partially in a lateral direction along one of the singulating scribe lines 161, . . . , 164.

The method according to a second aspect when referring back to the first aspect, wherein the substrate 100 includes a substrate thickness D, to be measured in the laser beam direction, being larger than a maximum penetration depth 125 of the focal point of the laser beam so that the microcracks 131, . . . , 135 are generated only up to a certain depth within the substrate 100, wherein this certain depth is smaller than half of the substrate thickness ½ D.

The method according to a third aspect when referring back to any of the first to second aspects, wherein the recess 200 is generated by means of subtractive structuring of the substrate 100, resulting in a reduction of the substrate thickness D in the area of the recess 200.

The method according to a fourth aspect when referring back to any of the first to third aspects, wherein generated the recess 200 in the substrate 100 is carried out before laser-based creating the microcracks 131, . . . , 135 in the substrate 100, and wherein the laser beam 121, . . . , 125 guided laterally along the singulating scribe lines 161, . . . , 164 is also guided laterally across the recess 200 so that, despite the same laser power, the focal point penetrates deeper into the substrate 100 at the location of the recess 200, compared to a substrate portion without a recess 200.

The method according to a fifth aspect when referring back to any of the first to fourth aspects, wherein the recess 200 is generated in the form of an elongated trench structure extending at least partially in the lateral direction along the respective singulating scribe line 161, . . . , 164.

The method according to a sixth aspect when referring back to any of the first to fifth aspects, herein the recess 200 extends in the lateral direction fully across the entire length of the respective singulating scribe line 161, . . . , 164.

The method according to a seventh aspect when referring back to any of the first to sixth aspects, wherein the recess 200 is structured into a first substrate surface 110 so that the recess 200 extends vertically into the substrate 100 starting from the first substrate surface 110.

The method according to an eight aspect when referring back to the seventh aspect, wherein the substrate 100 is configured in the form of a multi-layer substrate stack, and wherein the recess 200 extends vertically fully through precisely one of the outer substrate layers 101, 103.

The method according to a ninth aspect when referring back to the seventh aspect, wherein the substrate 100 is configured in the form of a multi-layer substrate stack, and wherein the recess 200 extends vertically partially through precisely one of the outer substrate layers 101, 103 in the substrate stack 100.

The method according to a tenth aspect when referring back to any of the first to ninth aspects, wherein the substrate 100 is configured in the form of a multi-layer substrate stack with at least three substrate layers 101, 102, 103 arranged on top of each other, and wherein the recess 200 is generated in at least one of the three substrate layers 101, 102, 103.

The method according to an eleventh aspect when referring back to any of the first to tenth aspects, wherein the method further includes: generating at least one second recess 201 in the substrate 100, wherein the second recess 201 extends at least partially in the lateral direction along one of the singulating scribe lines 161, . . . , 164.

The method according to a twelfth aspect when referring back to the eleventh aspect, wherein both recesses 200, 201 each extend along the same singulating scribe line 161, . . . , 164.

The method according to a thirteenth aspect when referring back to the eleventh to twelfth aspects, wherein one of the two recesses 200, 201 is structured into a first substrate surface 110, and wherein the respectively other one of the two recesses 200, 201 is structured into a second substrate surface 120 opposing the first substrate surface 110.

The method according to a fourteenth aspect when referring back to any of the eleventh to thirteenth aspects, wherein the substrate 100 is configured in the form of a multi-layer substrate stack, and wherein the two recesses 200, 201 are each configured in different substrate layers 101, 103 of the substrate stack.

The method according to a fifteenth aspect when referring back to any of the eleventh to fourteenth aspects, wherein, in a top view of the substrate 100, the two recesses 200, 201 are laterally displaced with respect to each other.

The method according to a sixteenth aspect when referring back to the fifteenth aspect, wherein, in a top view of the substrate 100, the two recesses 200, 201 laterally border each other.

The method according to a seventeenth aspect when referring back to any of the eleventh to sixteenth aspects, the method further including: generating at least one third recess 202 in the substrate 100, wherein the third recess 202 extends at least partially in the lateral direction along one of the singulating scribe lines 161, . . . , 164.

The method according to an eighteenth aspect when referring back to the seventeenth aspect, wherein the three recesses 200, 201, 202 each extend along the same singulating scribe line 161, . . . , 164.

The method according to a nineteenth aspect when referring back to any of the seventeenth to eighteenth aspects, wherein the substrate 100 is configured in the form of a multi-layer substrate stack, and wherein the three recesses 200, 201, 202 are each configured in different substrate layers 101, 102, 103.

The method according to a twentieth aspect when referring back to any of the seventeenth to nineteenth aspects, wherein, in a top view of the substrate 100, the three recesses 200, 201, 202 are laterally displaced with respect to each other.

The method according to a twenty-first aspect when referring back to the twentieth aspect, wherein, in a top view of the substrate 100, the three recesses 200, 201, 202 laterally border each other.

The method according to a twenty-second aspect when referring back to any of the first to twenty-first aspects, wherein the microchips 160 to be singulated are each laterally surrounded by precisely four singulating scribe lines 161, . . . , 164 arranged rectangularly, and (A) wherein, per microchip 160, one or multiple recesses 200, 201, 202 extend along precisely one of the four singulating scribe lines 161, . . . , 164, or (B) wherein, per microchip 160, two or more recesses 200, 201, 202 each extend along precisely two different singulating scribe lines 161, . . . , 164, or (C) wherein, per microchip, three or more recesses 200, 201, 202 each extend along precisely three different singulating scribe lines 161, . . . , 164, or (D) wherein, per microchip, four or more recesses 200, 201, 202 each extend along precisely four different singulating scribe lines 161, . . . , 164.

The above-described embodiments merely represent an illustration of the principles of the present disclosure. It is understood that other persons skilled in the art will appreciate modifications and variations of the arrangements and details described herein. This is why it is intended that the disclosure be limited only by the scope of the following claims rather than by the specific details that have been presented herein using the description and the discussion of the embodiments.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device.

While this disclosure has been described in terms of several embodiments, there are alterations, permutations, and equivalents which fall within the scope of this disclosure. It should also be noted that there are many alternative ways of implementing the methods and compositions of the present disclosure. It is therefore intended that the following appended claims be interpreted as including all such alterations, permutations and equivalents as fall within the true spirit and scope of the present disclosure.

The invention claimed is:

1. A method for singulating microchips, the method comprising:

providing a single-layer or multi-layer substrate;

creating microcracks in the substrate based on a laser beam that penetrates the substrate, wherein the laser beam is guided laterally around the microchips so as to generate singulating scribe lines in the substrate along which the microchips are to be singulated, and wherein the laser beam is guided laterally across the substrate in multiple passes, and wherein the focal point of the laser beam is set to different penetration depths in different passes each so that the microcracks created in the focal point are generated in the substrate in a step-wise manner; and generating at least one recess in the substrate, wherein the at least one recess extends at least partially in a lateral direction along one of the singulating scribe lines.

2. The method according to claim 1, wherein the substrate comprises a substrate thickness D, to be measured in the laser beam direction, being larger than a maximum penetration depth of the focal point of the laser beam so that the microcracks are generated only up to a certain depth within the substrate, and wherein the certain depth is smaller than half of the substrate thickness ½ D.

3. The method according to claim 1, wherein the recess is generated based on subtractive structuring of the substrate, resulting in a reduction of the substrate thickness D in the area of the recess.

4. The method according to claim 1, wherein generating the recess in the substrate is carried out before laser-based creating of the microcracks in the substrate, and wherein the laser beam guided laterally along the singulating scribe lines is also guided laterally across the at least one recess so that, despite the same laser power, the focal point penetrates deeper into the substrate at the location of the at least one recess, compared to a substrate portion without the at least one recess.

5. The method according to claim 1, wherein the at least one recess is generated in the form of an elongated trench structure extending at least partially in the lateral direction along the respective singulating scribe line.

6. The method according to claim 1, wherein the at least one recess extends in the lateral direction fully across the entire length of the respective singulating scribe line.

7. The method according to claim 1, wherein the at least one recess is structured into a first substrate surface so that the at least one recess extends vertically into the substrate starting from the first substrate surface.

8. The method according to claim 7, wherein the substrate is configured in the form of a multi-layer substrate stack, and wherein the at least one recess extends vertically fully through precisely one of the outer substrate layers, or wherein the substrate is configured in the form of a multi-layer substrate stack, and wherein the at least one recess extends vertically partially through precisely one of the outer substrate layers in the substrate stack.

9. The method according to claim 1, wherein the substrate is configured in the form of a multi-layer substrate stack with at least three substrate layers arranged on top of each other, and wherein the at least one recess is generated in at least one of the at least three substrate layers.

10. The method according to claim 1, wherein the method further comprises generating at least one second recess in the substrate, wherein the at least one second recess extends at least partially in the lateral direction along one of the singulating scribe lines.

11. The method according to claim 10, wherein both of the at least one recess and the at least one second recess each extend along the same singulating scribe line.

12. The method according to claim 10, wherein one of the at least one recess and the at least one second recess is structured into a first substrate surface, and wherein the respectively other one of the at least one recess and the at least one second recess is structured into a second substrate surface opposing the first substrate surface.

13. The method according to claim 10, wherein the substrate is configured in the form of a multi-layer substrate stack, and wherein the at least one recess and the at least one second recess are each configured in different substrate layers of the substrate stack.

14. The method according to claim 10, wherein, in a top view of the substrate, the at least one recess and the at least one second recess are laterally displaced with respect to each other, or laterally border each other.

15. The method according to claim 10, further comprising generating at least one third recess in the substrate, wherein the at least one third recess extends at least partially in the lateral direction along one of the singulating scribe lines.

16. The method according to claim 15, wherein the at least one recess, the at least one second recess, and the at least one third recess each extend along the same singulating scribe line.

17. The method according to claim 15, wherein the substrate is configured in the form of a multi-layer substrate stack, and wherein the at least one recess, the at least one second recess, and the at least one third recess are each configured in different substrate layers.

18. The method according to claim 15, wherein, in a top view of the substrate, the at least one recess, the at least one second recess, and the at least one third recess are laterally displaced with respect to each other.

19. The method according to claim 18, wherein, in a top view of the substrate, the at least one recess, the at least one second recess, and the at least one third recess laterally border each other.

20. The method according to claim 1, wherein the microchips to be singulated are each laterally surrounded by precisely four singulating scribe lines arranged rectangularly, and (A) wherein, per microchip, one or multiple recesses extend along precisely one of the four singulating scribe lines, or (B) wherein, per microchip, two or more recesses each extend along precisely two different singulating scribe lines, or (C) wherein, per microchip, three or more recesses each extend along precisely three different singulating scribe lines, or (D) wherein, per microchip, four or more recesses each extend along precisely four different singulating scribe lines.

* * * * *